United States Patent [19]

Shinkawa et al.

[11] 4,435,688
[45] Mar. 6, 1984

[54] FET MICROWAVE OSCILLATOR BEING FREQUENCY STABILIZED BY CAPACITIVE REACTANCE MICRO-STRIP STUB LINE

[75] Inventors: Keiro Shinkawa; Masaki Noda; Chuichi Sodeyama, all of Yokohama, Japan

[73] Assignee: Hitachi, Ltd., Tokyo, Japan

[21] Appl. No.: 286,511

[22] Filed: Jul. 24, 1981

[30] Foreign Application Priority Data

Jul. 25, 1980 [JP] Japan .................................. 55-101309

[51] Int. Cl.³ .............................................. H03B 5/18
[52] U.S. Cl. ................................... 331/99; 331/117 D
[58] Field of Search ..................... 331/96, 99, 107 SL, 331/117 D

[56] References Cited

U.S. PATENT DOCUMENTS 4,149,127 4/1979 Murakami et al. .................... 331/99
4,187,476 2/1980 Shinkawa et al. .............. 331/117 D

OTHER PUBLICATIONS

Ishihara et al., "A Highly Stabilized GaAs FET Oscillator Using a Dielectric Resonator Feedback Circuit in 9-14 GHz," Aug. 1980, *IEEE Transactions on Microwave Theory and Techniques*, vol. MTT-28, No. 8, pp. 817-824.
Markus, *Guidebook of Electronic Circuits*, McGraw-Hill Book Co., New York, 1974, p. 602.

*Primary Examiner*—Siegfried H. Grimm
*Attorney, Agent, or Firm*—Antonelli, Terry & Wands

[57] ABSTRACT

A microwave oscillator circuit with an FET, a dielectric resonator and a micro-strip line has a capacitive reactance element connected between the source terminal of the FET and ground or between the source and drain terminals of the FET, so that the oscillation frequency fluctuations due to the power supply voltage fluctuations or the ambient temperature variations can be suppressed.

15 Claims, 9 Drawing Figures

FET MICROWAVE OSCILLATOR BEING FREQUENCY STABILIZED BY CAPACITIVE REACTANCE MICRO-STRIP STUB LINE

BACKGROUND OF THE INVENTION

This invention relates to a microwave oscillator circuit with a field effect transistor (hereinafter simply referred to as FET) and more particularly, to an improvement of a microwave oscillator circuit which is constituted by a micro-strip line, a dielectric resonator and an FET and which is suitale for use in, for example, a converter for conversion of SHF band TV signals into UHF band signals.

For example, U.S. patent application Ser. No. 84458 (corresponding to West German patent application No. P 2941826.6), now U.S. Pat. No. 4,307,352, issued Dec. 22, 1981 and titled "Micro-Strip Oscillator with Dielectric Resonator discloses a basic arrangement of a microwave oscillator circuit with a micro-strip line, a dielectric resonator and an FET. The microwave oscillator circuit with the micro-strip line and dielectric resonator, because of its relatively simplified circuit arrangement, has recently been applied to an SHF converter.

Illustrated in FIG. 1 is a prior art micro-wave oscillator circuit with an FET, a micro-strip line and a dielectric resonator. This oscillator circuit comprises a micro-strip line consisting of a stub 3, an output line 5, a filter 7 connected to the output line 5 and a gate line 10, an FET 1, a dielectric resonator 11, a bias resistor 6, and an end resistor 9, the FET 1 having its source terminal 4 connected to the output line 5, its drain terminal 2 connected to the stub 3 and its gate terminal 8 connected to the gate line 10. The bias resistor 6 is connected to the filter 7 and the end resistor 9 is connected to the gate line 10, thus setting up a current path for DC bias current to flow through the FET 1. The dielectric resonator 11 is disposed adjacent to the gate line 10 and electrically coupled therewith to constitute a resonant circuit. The stub 3 serves as a short-circuiting stub for ¼ wavelength so that the drain terminal 2 of the FET 1 is grounded in terms of high frequencies. In this oscillator circuit, an internal capacitance between the source and gate electrodes of the FET 1 acts as a feedback capacitance.

In the oscillator circuit of the above construction, when a power supply voltage $V_D$ is applied to a voltage supply terminal 12, this circuit oscillates with the voltage $V_D$ ranging from 2 to 10 volts to deliver an oscillating output by way of the output line 5. However, the oscillation frequency of this oscillator circuit fluctuates to a great extent when the power supply voltage $V_D$ fluctuates. For example, under the condition that the circuit is applied with a power supply voltage $V_D$ to 7 volts to oscillate at a frequency of 11 GHz, the oscillation frequency fluctuates by about 50 KHz/0.1 volt. Further, the oscillation frequency also fluctuates to a great extent when the ambient temperature varies. For example, the oscillation frequency is affected by temperature variations of the FET 1 to fluctuate by about 10 KHz/°C. However, it is necessary for a microwave oscillator, as applied to an SHF converter for reception of TV signals of about 12 GHz, to have an oscillation frequency fluctuation which is less than 300 KHz. Usually, the SHF converter is required to operate under temperature variations of from −10° C. to +50° C. When it comes to satisfying these requirements, the conventional oscillator circuit is not always satisfactory and is unsuitable for incorporation into the SHF converter.

In order to suppress the oscillation frequency fluctuation to below 5 KHz/°C., it is conceivable that a dielectric resonator be chosen which has temperature characteristics that cancel out the oscillation frequency fluctuation due to temperature variations of the FET. However, to cancel out different oscillation frequency fluctuations attributable to different FETs, it is necessary to choose a dielectric resonator having specified temperature characteristics meeting a specified FET used. Further, since the oscillation frequency fluctuation due to the power supply voltage fluctuation is affected by individuality of the FETs, it is difficult for the prior art microwave oscillator circuit to suppress the oscillation frequency fluctuation.

SUMMARY OF THE INVENTION

An object of the present invention is to provide a microwave oscillator circuit capable of minimizing the oscillation frequency fluctuation due to the ambient temperature variation or power supply voltage fluctuation and in particular a microwave oscillator circuit capable of minimizing the oscillation frequency fluctuation due to variations in characteristics of an FET used in the circuit.

As described above, variations in ambient temperature of the microwave oscillator circuit, especially, of the FET or fluctuations in the power supply voltage cause the oscillation frequency of the microwave oscillator circuit to fluctuate. In other words, the ambient temperature variations or the power supply voltage fluctuations first cause electrical characteristics of the FET to vary and as a result, the oscillation frequency fluctuates. Accordingly, if factors in the electrical characteristics of the FET which are sensitive to the ambient temperature variations or the power supply voltage fluctuations are unveiled, then a circuit arrangement will be established which can compensate for the factors to minimize the oscillation frequency fluctuation.

DESCRIPTION OF THE PREFERRED EMBODIMENTS

Figure 1:
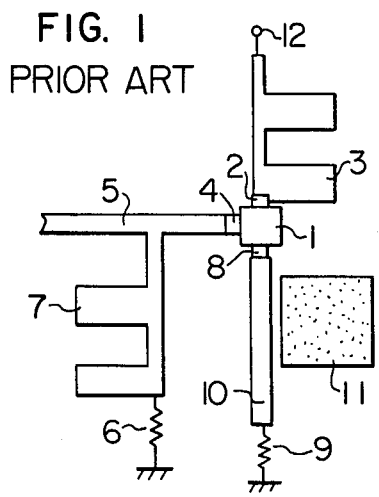
FIG. 1 is a circuit diagram showing a prior art microwave oscillator circuit.
Figure 2:
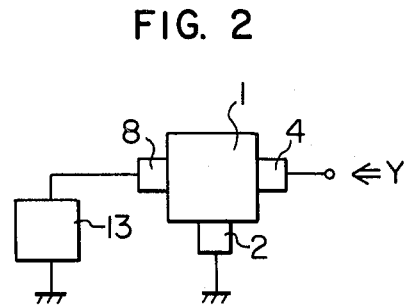
FIG. 2 is a block diagram showing a model of a microwave oscillator circuit with an FET.
Figure 3:
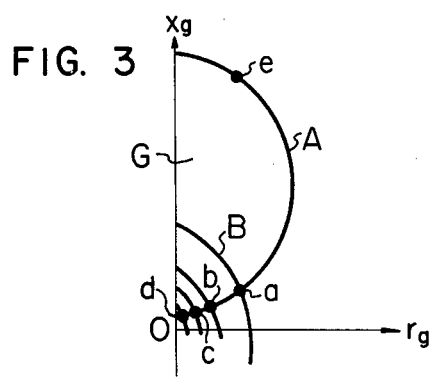
FIG. 3 is a graphical representation showing admittance at the source terminal at the FET.

FIG. 2 illustrates a model of an oscillator circuit with a grounded drain FET. In this circuit, when the impedance of a circuit connected to a gate 8 of the FET 1 is denoted by $r_g + jX_g$, an admittance Y at a source terminal 4 of the FET 1 can be derived from a diagram as shown in FIG. 3. Plotted on curve A is the admittance Y for its real part Re(Y) being zero. A region G surrounded by curve A and axis Xg corresponds to a negative conductance region. Plotted on curve B is the admittance Y for its imaginary part Im(Y) being zero. Accordingly, oscillation operating points when a pure resistance is connected to the gate terminal 8 lie on curve B within the region G. In accordance with the connection of a capacitor having a reactance of 5 Ω, 10 Ω or 15 Ω across the source 4 of FET 1 and ground, an intersecting point a on both the curves A and B respectively representative of Re(Y)=0 and In(Y)=0 shifts to a point b, c or d on curve A. When the ambient temperature of the FET 1 varies, there occur variations in the capacitive component value of the admittance at the source terminal 4 of the FET 1. Thus, with the capacitance increased, the point a shifts toward point d on curve A whereas with the capacitance decreased, the point a shifts toward point e. This leads to variations in the oscillation frequency of the oscillator circuit. Typically, the reactance at the source 4 of FET 1 is about 1 Ω but depends on an FET used, and hence the variation in the capacitive component value of the admittance due to the ambient temperature variation or the power supply voltage fluctuation depends on the used FET, resulting in the oscillation frequency fluctuation that is affected by individuality of the FET used.

As will be seen from the foregoing description, the connection of a capacitive reactance element to the source terminal 4 of the FET 1 is effective to shift the operating point of the oscillator circuit to the point b, c or d shown in FIG. 3. Then, when the point c or d, for example, is selected as the operating point, this oscillation operating point remains almost unchanged even when the output admittance at the source terminal 4 of the FET 1 varies. To conclude, when a capacitive reactance element of a larger value than the reactance at the source terminal 4 of the FET 1 is connected to that source terminal 4, the admittance at the source terminal 4 remains almost unchanged even when the ambient temperature varies or the power supply voltage fluctuates and hence the oscillation frequency fluctuation can be minimized. Of course, the reactance of that capacitive reactance element should be immune to the ambient temperature variations and the power supply voltage fluctuations.

Figure 4:
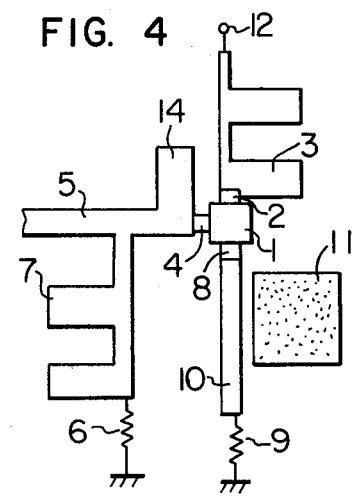
FIG. 4 is a circuit diagram showing a first embodiment of a microwave oscillator circuit according to the invention.

FIG. 4 illustrates a microwave oscillator circuit according to the invention. In this circuit, a capacitive stub 14 is connected to an output line 5 connected with a source terminal 4 of an FET 1 so that a capacitive reactance is set up between source and drain terminals 4 and 2 of the FET 1. The reactance of the stub 14 is of course selected such that the oscillation operating point is located at point c or d as shown in FIG. 3. The end of the capacitive stub 14 which is disposed farthest from the source terminal 4 of the FET 1 is opened and is coupled to ground at microwave frequencies.

Figure 5:
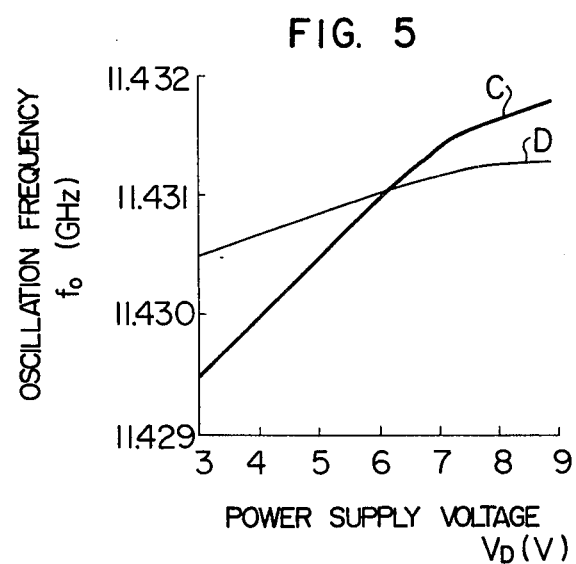
FIG. 5 is a graph showing characteristics of the microwave oscillator circuit of the invention, especially, the relation between power supply voltage and oscillation frequency.

Illustrated in FIG. 5 is the relation between oscillation frequency and power supply voltage when the reactance of the capacitive stub 14 is so selected as to be 15 Ω. In FIG. 5, curve D represents the oscillation frequency fluctuation in the microwave oscillator circuit according to the present invention while curve c represents the oscillation frequency fluctuation in the prior art microwave oscillator circuit, wherein abscissa denotes the power supply voltage and ordinate the oscillation frequency. As will be seen from FIG. 5, in contrast to the oscillation frequency fluctuation being about 500 KHz/volt in the prior art oscillator circuit, the oscillation frequency fluctuation can be minimized to 200 KHz/volt (20 KHz/0.1 volt) in the oscillator circuit of the present invention.

Figure 6:
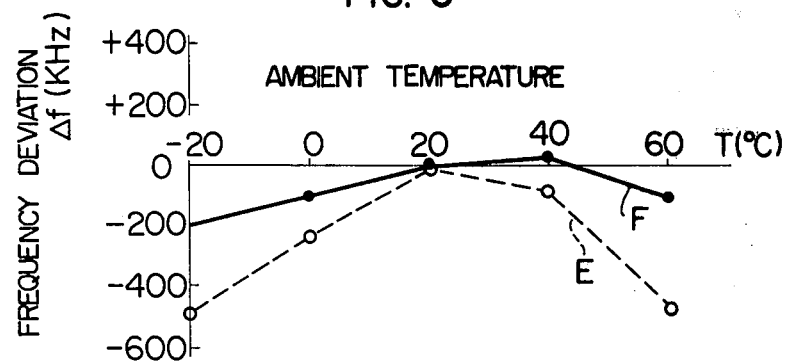
FIG. 6 is a graph showing characteristics of the microwave oscillator circuit of the invention, especially, the relation between ambient temperature and oscillation frequency deviation.

Illustrated in FIG. 6 is the relation between ambient temperature and oscillation frequency deviation when the reactance of the capacitive stub 14 is so selected as to be 15 Ω. In FIG. 6, curve F represents the oscillation frequency fluctuation in the microwave oscillator circuit according to the invention while curve E represents the oscillation frequency fluctuation in the prior art microwave oscillator circuit, wherein the abscissa denotes the ambient temperature T (°C.) and the ordinate denotes the frequency deviation Δf (KHz). As will be seen from FIG. 6, while the frequency deviation is about 300 KHz at −10° C. or +50° C. in the prior art oscillator circuit, the frequency deviation is suppressed to below 200 KHz within an ambient temperature variation range of from −10° C. to +50° C. in the oscillator circuit of the present invention.

Figure 7A:
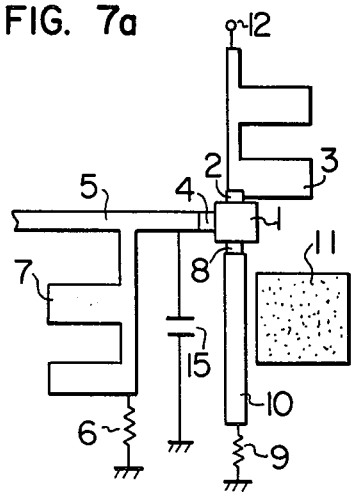
FIGS. 7a and 7b are circuit diagrams showing a second embodiment of the invention.
Figure 7B:
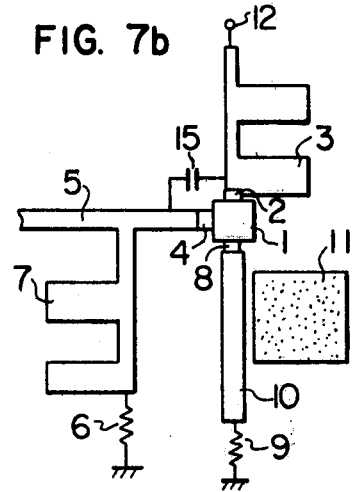

FIGS. 7a and 7b illustrate a second embodiment of the microwave oscillator circuit according to the invention, wherein a capacitor 15 is connected between source terminal 4 and ground or between source and drain terminals 4 and 2. The reactance of the capacitor 15 is of course selected to be about 15 Ω.

Figure 8:
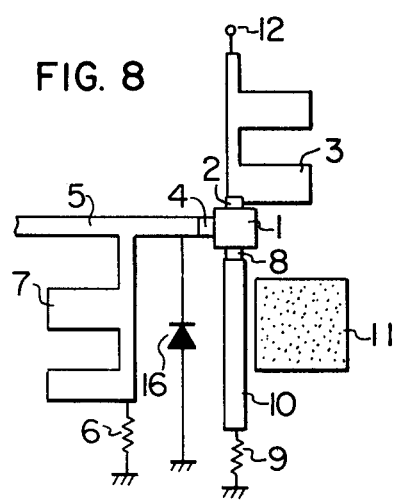
FIG. 8 is a circuit diagram showing a third embodiment of the invention.

FIG. 8 illustrates a third embodiment of the microwave oscillator circuit according to the invention, wherein a diode 16 is connected between output line 5 and ground. It will be appreciated that the diode 16 has its cathode connected to the output line 5 and its anode connected to ground so that a reactance due to an anode-cathode capacitance of the diode 16 is established.

In the second and third embodiments of the invention as shown in FIGS. 7a, 7b and FIG. 8, the oscillation frequency fluctuation can be minimized as in the first embodiment of FIG. 4, provided that the reactance of the capacitor 15 or of the junction capacitor of the diode 16 is selected to be about 15 Ω, and that this reactance is immune to the ambient temperature variations and the power supply voltage fluctuations.

As described above, according to the invention, it is possible to provide the microwave oscillator circuit with the FET, micro-strip line and dielectric resonator which is simplified in circuit arrangement and which is capable of suppressing the oscillation frequency fluctuations due to the ambient temperature variations and the power supply voltage fluctuations, by connecting the capacitive reactance between the source terminal of the FET and ground or between the source and drain terminals. The thus arranged microwave oscillator circuit is practically satisfactory for incorporation into the SHF converter.

We claim:

1. A microwave oscillator comprising:
    a FET having source, drain and gate terminals;
    a micro-strip line connected to said drain terminal, said micro-strip line being grounded at microwave frequencies;

an output line made of a micro-strip line, said output line being connected to the source terminal of said FET;

a gate line made of a micro-strip line, said gate line being connected to the gate terminal of said FET;

a dielectric resonator disposed adjacent to said gate line and electrically coupled therewith and;

a capacitive stub disposed adjacent to said FET and formed by a micro-strip line of which one end is connected to the source terminal of said FET and the other end is opened, said capacitive stub being a source terminal ground at microwave frequencies.

2. A microwave oscillator according to claim 1 wherein said capacitive stub is coupled to said micro-strip output line.

3. A microwave oscillator comprising:
a FET having source, drain and gate terminals;
a micro-strip line connected to said drain terminal, said micro-strip line being grounded at microwave frequencies;
an output line made of a micro-strip line, said output line being connected to the source terminal of said FET;
a gate line made of a micro-strip line, said gate line being connected to the gate terminal of said FET;
a dielectric resonator disposed adjacent to said gate line and electrically coupled therewith; and
a capacitive reactance disposed adjacent to said FET and being coupled to said source terminal and another part in said microwave oscillator.

4. A microwave oscillator according to claim 3 wherein said capacitive reactance comprises a capacitor.

5. A microwave oscillator according to claim 4 wherein the capacitor has one end connected to the source terminal of said FET and the other end connected to the drain terminal of said FET.

6. A microwave oscillator according to claim 4 wherein the capacitor has one end connected to the source terminal of said FET and the other end grounded.

7. A microwave oscillator according to claim 3 wherein said capacitive reactance comprises a diode having its cathode connected to the source terminal of said FET and its anode grounded.

8. A microwave oscillator according to claim 3 wherein said capacitive reactance is coupled to said micro-strip output line.

9. A microwave oscillator according to claim 3 wherein said capacitive reactance comprises a capacitor.

10. A microwave oscillator according to claim 9 wherein the capacitor has one end connected to the source terminal of said FET and the other end connected to the drain terminal of said FET.

11. A microwave oscillator according to claim 9 wherein the capacitor has one end connected to the source terminal of said FET and the other end grounded.

12. A microwave oscillator according to claim 3 wherein said capacitive reactance comprises a diode having its cathode connected to the source terminal of said FET and its anode grounded.

13. A microwave oscillator according to claim 3 wherein said capacitive reactance is coupled to said micro-strip output line.

14. A microwave oscillator comprising:
a FET having source, drain and gate terminals;
a micro-strip line connected to said drain terminal, said micro-strip line being grounded at microwave frequencies;
an output line made of a micro-strip line, said output line being connected to the source terminal of said FET;
a gate line made of a micro-strip line, said gate line being connected to the gate terminal of said FET;
a dielectric resonator disposed adjacent to said gate line and electrically coupled therewith; and
a capacitive stub disposed adjacent to said FET and being coupled to said source terminal and being a source terminal ground at microwave frequencies.

15. A microwave oscillator according to claim 14 wherein said capacitive stub is coupled to said output line.

* * * * *